US012609278B2

(12) United States Patent
Nanao et al.

(10) Patent No.: US 12,609,278 B2
(45) Date of Patent: Apr. 21, 2026

(54) MULTI CHARGED PARTICLE BEAM WRITING METHOD AND MULTI CHARGED PARTICLE BEAM WRITING APPARATUS

(71) Applicant: NuFlare Technology, Inc., Yokohama (JP)

(72) Inventors: Tsubasa Nanao, Yokohama (JP); Osamu Iizuka, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 635 days.

(21) Appl. No.: 17/812,815

(22) Filed: Jul. 15, 2022

(65) Prior Publication Data

US 2022/0359156 A1     Nov. 10, 2022

Related U.S. Application Data

(63) Continuation of application No. PCT/JP2021/003213, filed on Jan. 29, 2021.

(30) Foreign Application Priority Data

Feb. 20, 2020 (JP) ................................. 2020-027319

(51) Int. Cl.
*H01J 37/304* (2006.01)
*G03F 7/00* (2006.01)
(Continued)

(52) U.S. Cl.
CPC ........ *H01J 37/3045* (2013.01); *G03F 7/7045* (2013.01); *H01J 37/1472* (2013.01); *H01J 37/3177* (2013.01); *H01J 2237/3045* (2013.01)

(58) Field of Classification Search
None
See application file for complete search history.

(56) References Cited

U.S. PATENT DOCUMENTS 8,362,450 B2   1/2013  Iizuka et al.
9,859,096 B2   1/2018  Ogasawara
(Continued)

FOREIGN PATENT DOCUMENTS

JP     08-01 7696 A     1/1996
JP     2004-071691 A    3/2004
(Continued)

OTHER PUBLICATIONS

International Search Report issued Apr. 20, 2021 in PCT/JP2021/003213 filed on Jan. 29, 2021, 2 pages.
(Continued)

*Primary Examiner* — James Choi
(74) *Attorney, Agent, or Firm* — Oblon, McClelland, Maier & Neustadt, L.L.P.

(57) ABSTRACT

The mark position is measured with a multi-beam with high accuracy. A multi charged particle beam writing method includes forming a multi-beam in which charged particle beams are arranged with a predetermined pitch, irradiating a mark with beams in an on-beam region while shifting irradiation positions of the charged particle beams by sequentially changing the on-beam region in which beams in a partial region of the multi-beam are set to ON, the mark being provided at a predetermined position and having a width greater than the predetermined pitch, detecting a reflected charged particle signal from the mark, and calculating a position of the mark, and adjusting the irradiation positions of the multi-beam based on the calculated position of the mark, and writing a pattern.

19 Claims, 11 Drawing Sheets

(51) Int. Cl.

| | |
|---|---|
| *H01J 37/147* | (2006.01) |
| *H01J 37/317* | (2006.01) |

(56) References Cited

U.S. PATENT DOCUMENTS

| | | | |
|---|---|---|---|
| 9,966,228 | B2 | 5/2018 | Iizuka |
| 10,109,458 | B2 | 10/2018 | Iizuka |
| 10,224,171 | B2 | 3/2019 | Touya et al. |
| 2005/0269524 | A1* | 12/2005 | Hastings ................ B82Y 10/00 |
| | | | 250/492.23 |
| 2007/0023689 | A1 | 2/2007 | Iizuka et al. |
| 2013/0168569 | A1 | 7/2013 | Yamaguchi et al. |
| 2015/0041672 | A1* | 2/2015 | Kamikubo ............ H01J 37/045 |
| | | | 250/397 |
| 2016/0086764 | A1 | 3/2016 | Iizuka et al. |
| 2017/0103869 | A1* | 4/2017 | Matsumoto ......... H01J 37/3177 |
| 2017/0169993 | A1 | 6/2017 | Iizuka |
| 2017/0243716 | A1 | 8/2017 | Ogasawara |
| 2017/0345612 | A1 | 11/2017 | Touya et al. |
| 2017/0358425 | A1 | 12/2017 | Iizuka |
| 2018/0138013 | A1 | 5/2018 | Iizuka et al. |
| 2018/0197717 | A1* | 7/2018 | Wake .................. H01J 37/3026 |
| 2019/0035603 | A1* | 1/2019 | Iizuka .................. H01J 37/304 |

FOREIGN PATENT DOCUMENTS

| | | | | | |
|---|---|---|---|---|---|
| JP | 2004-134503 | A | 4/2004 | | |
| JP | 4401557 | B2 * | 1/2010 | ............. | B82Y 10/00 |
| JP | 2013-140844 | A | 7/2013 | | |
| JP | 2016-063149 | A | 4/2016 | | |
| JP | 2017-107959 | A | 6/2017 | | |
| JP | 2017-151155 | A | 8/2017 | | |
| JP | 2017-220615 | A | 12/2017 | | |
| JP | 2018-078251 | A | 5/2018 | | |
| TW | 200715371 | A | 4/2007 | | |
| TW | 201805987 | A | 2/2018 | | |

OTHER PUBLICATIONS

Taiwanese Office Action issued Dec. 28, 2021 in Taiwanese Application No. 110103144, 13 pages (with English Machine Translation).

Taiwanese Rejection issued Apr. 26, 2022 in Taiwanese Application No. 110103144, 7 pages (with English Machine Translation).

* cited by examiner

WRITE FIRST LAYER PATTERN
AND MARK PATTERN — S11

DEVELOPMENT AND ETCHING — S12

PERFORM SWITCH SCAN — S13

CALCULATE MARK POSITION — S14

WRITE SECOND LAYER — S15

DEVELOPMENT AND ETCHING — S16

Fig. 8a
Fig. 8b
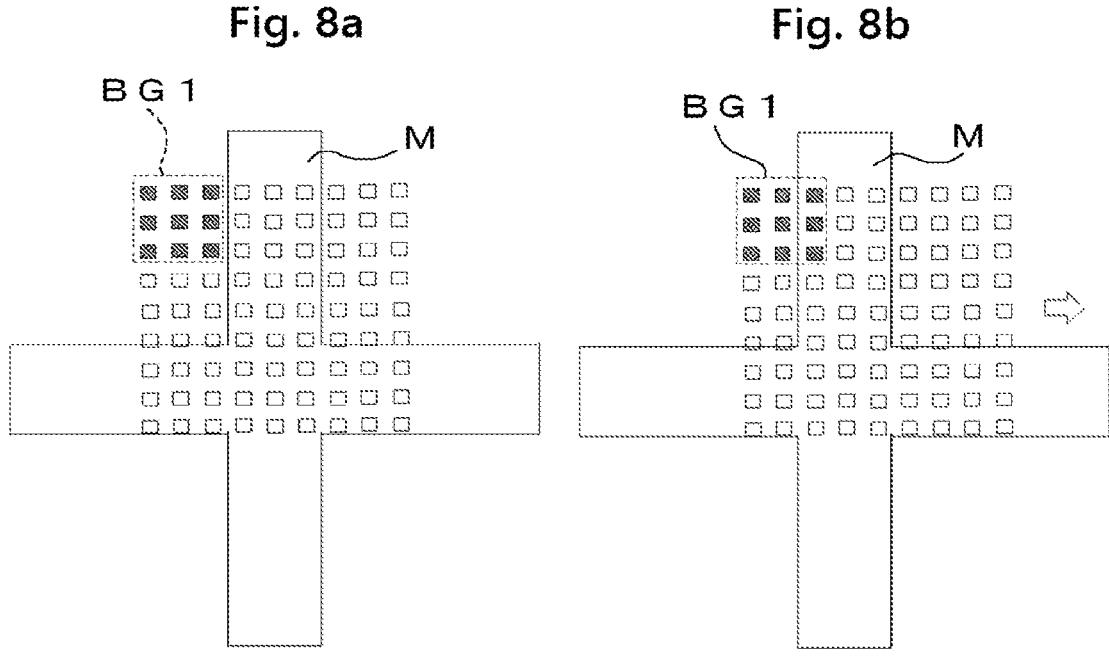
Fig. 8c
REFLECTED ELECTRON
SIGNAL INTENSITY
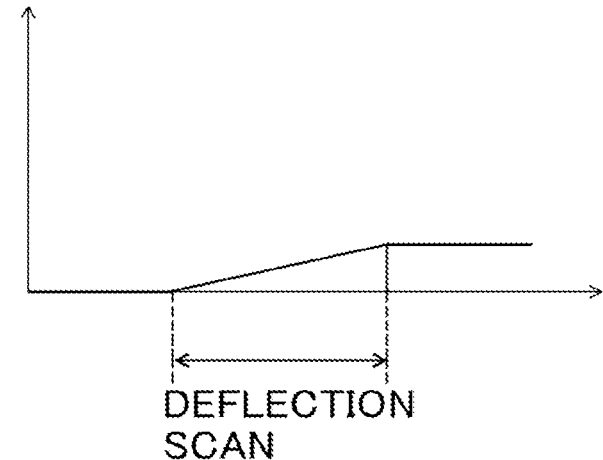
DEFLECTION
SCAN

REFLECTED ELECTRON
SIGNAL INTENSITY

DEFLECTION
SCAN

Fig. 10a          ## Fig. 10b
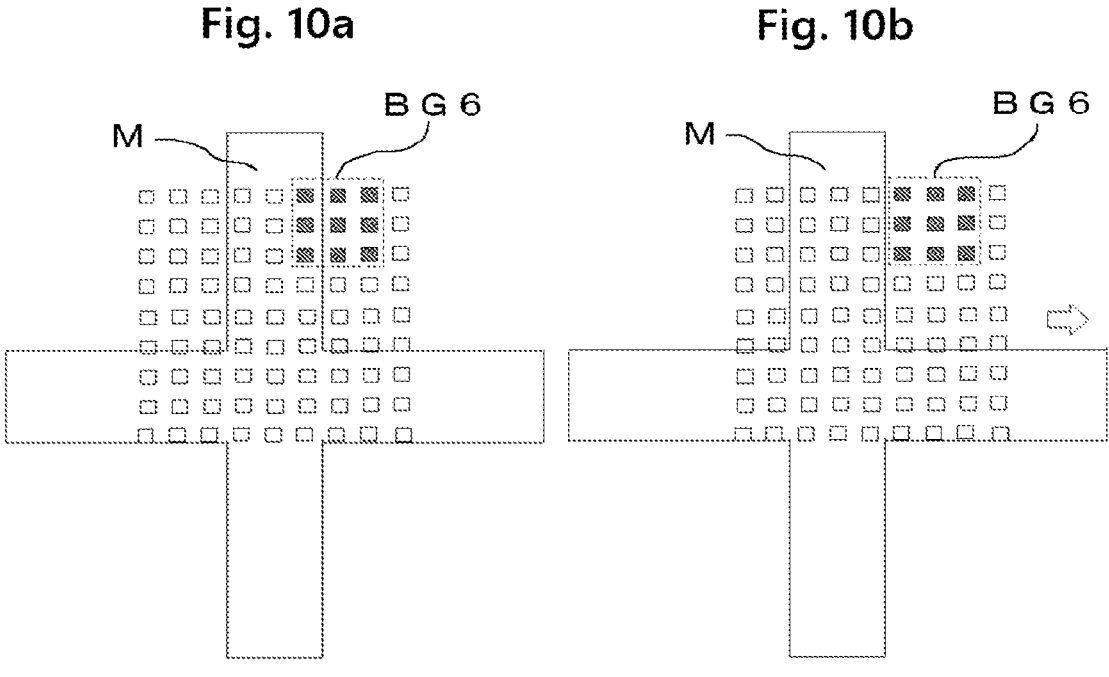
Fig. 10c
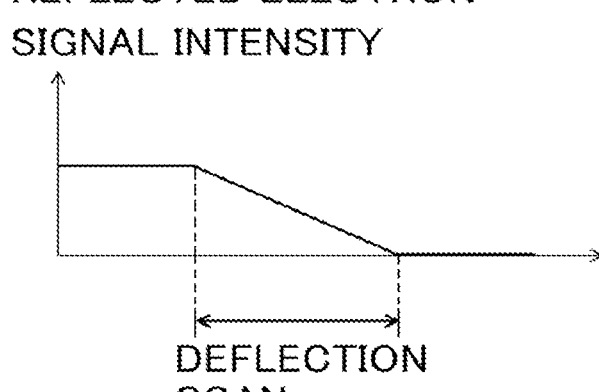
REFLECTED ELECTRON
SIGNAL INTENSITY
DEFLECTION
SCAN REFLECTED ELECTRON
SIGNAL INTENSITY          Fig. 11
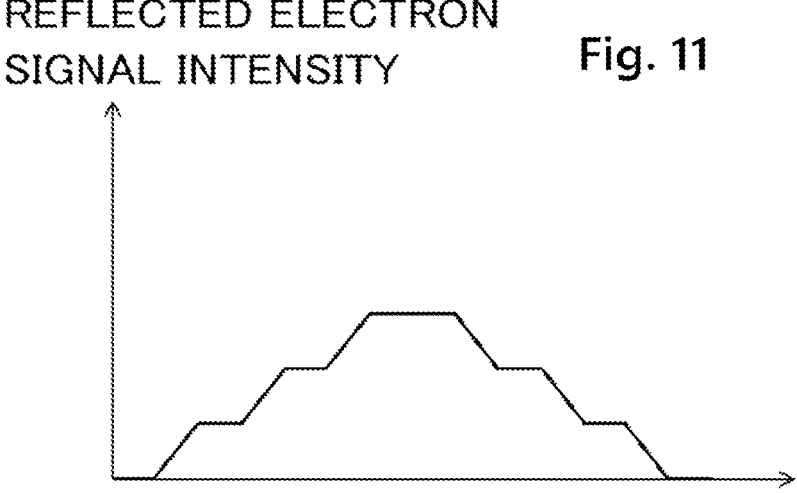
Fig. 12a                    Fig. 12b

1

MULTI CHARGED PARTICLE BEAM WRITING METHOD AND MULTI CHARGED PARTICLE BEAM WRITING APPARATUS

TECHNICAL FIELD

The present invention relates to a multi charged particle beam writing method and a multi charged particle beam writing apparatus.

BACKGROUND

As LSI circuits are increasing in density, the line width of circuits of semiconductor devices is becoming finer. To form a desired circuit pattern onto a semiconductor device, a method of demagnifying and transferring, by using a demagnification-projection exposure apparatus, onto a wafer a highly precise original image pattern formed on a quartz is employed. The highly precise original image pattern is written by using an electron beam writing apparatus, in which a technology commonly known as electron beam lithography is used.

A writing apparatus that uses a multi-beam can irradiate with many beams at one time, as compared to when writing is performed with a single electron beam, thus the throughput can be significantly improved. In a multi-beam writing apparatus using a blanking aperture array (blanking plate) as an embodiment of the multi-beam writing apparatus, an electron beam discharged from an electron gun passes through a shaping aperture array having a plurality of openings, thus a multi-beam (a plurality of electron beams) is formed. The multi-beam passes through corresponding blankers (electrode pairs) of the blanking aperture array. The blanker has an electrode pair for independently deflecting a beam, and an opening for beam passage is formed between the electrode pair. Blanking deflection is performed on a passing electron beam by fixing one electrode of the blanker to the ground potential and switching the other electrode between the ground potential and other potential. An electron beam deflected by the blanker is blocked and turned OFF, and an electron beam not deflected by the blanker is radiated to a substrate on a stage as an on-beam.

In a multi-beam writing, a writing operation is temporarily halted in a certain writing unit, a mark on the stage is irradiated (scanned) with a multi-beam while the beam is being shifted, a reflected electron signal from the mark is detected, the mark position is calculated from detection results to determine the amount of beam drift (the amount of shift of the entire beam), and drift correction is performed.

A phase shift method is known as a technique to improve the resolution in photolithography. A phase shift mask needs two patterns: a layer with a light shielding pattern and a layer with a half tone pattern, thus the positioning (alignment) precision when these patterns are overlaid is important. For instance, a cross mark pattern for alignment is created at the time of formation of a pattern for the first layer. The cross mark is then scanned with a multi-beam to detect a reflected electron signal, the position of the cross mark is calculated from detection results, and the writing position of the pattern of the second layer is adjusted.

In this manner, in a multi-beam writing, a mark provided on a stage or a substrate is scanned with a multi-beam, and the position of the mark is measured. Because the current density of a single beam is low, when the position of the mark is measured by a multi-beam, multiple beams in a specific region are set to ON and collectively treated as a single beam, and the mark is scanned with the single beam. As illustrated in FIG. 13, it is necessary to scan a wide range greater than the sum of the size of beam region BG1 and width W of mark M. Thus, when a multi-beam is deflected by a deflector to perform scanning, deflection distortion may occur or the beam may come closer to the deflector to generate drift, and it is difficult to measure the mark position accurately.

CITATION LIST

Patent Literature

PTL 1: JP 2017-220615 A
PTL 2: JP 2017-107959 A
PTL 3: JP 2017-151155 A

SUMMARY OF INVENTION

It is an object of the present invention to provide a multi charged particle beam writing method and a multi charged particle beam writing apparatus that are capable of measuring the mark position with a multi-beam with high accuracy.

According to one aspect of the present invention, a multi charged particle beam writing method includes forming a multi-beam in which charged particle beams are arranged with a predetermined pitch, irradiating a mark with beams in an on-beam region while shifting irradiation positions of the charged particle beams by sequentially changing the on-beam region in which beams in a partial region of the multi-beam are set to ON, the mark being provided at a predetermined position and having a width greater than the predetermined pitch, detecting a reflected charged particle signal from the mark, and calculating a position of the mark, and adjusting the irradiation positions of the multi-beam based on the calculated position of the mark, and writing a pattern.

According to one aspect of the present invention, a multi charged particle beam writing apparatus includes an aperture array substrate forming a multi-beam in which charged particle beams are arranged with a predetermined pitch, a stage on which a writing target substrate is placed, the writing target substrate being to be irradiated with the multi-beam, a controller shifting irradiation positions of the charged particle beams by sequentially changing an on-beam region in which beams in a partial region of the multi-beam are set to ON, a mark being provided on the stage or on the writing target substrate and having a width greater than the predetermined pitch, and a mark position calculator calculating a position of the mark based on a reflected charged particle signal detected by irradiating the mark with beams in the on-beam region.

Advantageous Effects of Invention

According to the present invention, a mark position can be measured by a multi-beam with high accuracy.

BRIEF DESCRIPTION OF DRAWINGS

FIG. 8*a*, FIG. 8*b* are views for illustrating a scan method, and FIG. 8*c* is a graph illustrating results of detection of a reflected electron signal.

FIG. 10*a*, FIG. 10*b* are views for illustrating a scan method, and FIG. 10*c* is a graph illustrating results of detection of a reflected electron signal.

FIG. 11 is a graph illustrating a combination of results of detection of a reflected electron signal.

FIG. 12*a*, FIG. 12*b* are views for illustrating the centroid of an on-beam region.

DESCRIPTION OF EMBODIMENTS

Hereinafter an embodiment of the present invention will be described with reference to the drawings. In the embodiment, a configuration using an electron beam as an example of a charged particle beam will be described. However, the charged particle beam is not limited to the electron beam, and may be an ion beam or the like.

Figure 1:
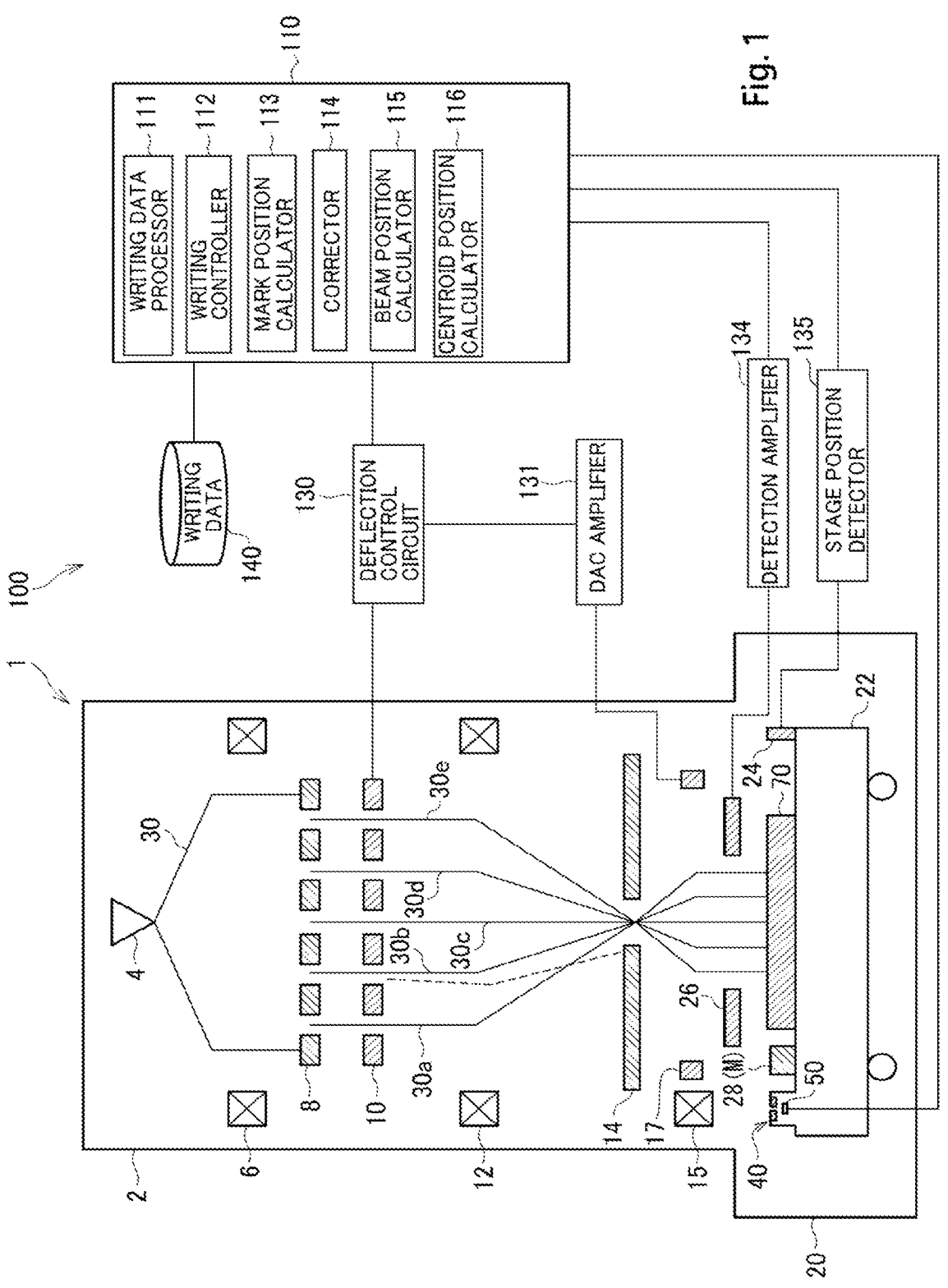
FIG. 1 is a schematic diagram of a multi charged particle beam writing apparatus according to an embodiment of the present invention.

FIG. 1 is a conceptual diagram illustrating the configuration of a writing apparatus in the embodiment. In FIG. 1, the writing apparatus includes a writer 1 and a controller 100. The writing apparatus is an example of a multi charged particle beam writing apparatus. The writer 1 includes a column 2 and a writing chamber 20. In the column 2, an electron gun 4, an illuminating lens 6, a shaping aperture array substrate 8, a blanking plate 10, a demagnification lens 12, a limiting aperture member 14, an object lens 15, a deflector 17 and the like are disposed.

An XY stage 22 and a detector 26 are placed in the writing chamber 20. A substrate 70 serving as a writing target is placed on the XY stage 22. The height of the substrate 70 is adjustable by Z stage (not illustrated). The substrate 70 is, for instance, a mask blank or a semiconductor substrate (silicon wafer).

On the XY stage 22, a mirror 24 for position measurement of the XY stage 22 is disposed. In addition, a mark substrate 28, in which a mark M (see FIGS. 4*a* to 4*d*) for beam calibration is formed, is provided on the XY stage 22. The mark M is made of metal, and has a cross shape, for instance, to facilitate the detection of its position by scanning with an electron beam. When the cross of the mark M is scanned with an electron beam, the detector 26 detects a reflected electron signal from the mark M.

A mark 40 for beam position detection is disposed on the XY stage 22 at a position different from the position where the substrate 70 is placed. The mark 40 is, for instance, a transparent mark, and a current detector 50 is provided below the mark 40. The height of the mark 40 is adjustable by an adjustment mechanism (not illustrated).

The mark 40 restricts electron beams so that only one of them passes through. The mark 40 has, for instance, a circular planar shape, and a through-hole is formed therein, through which one beam passes along the central axis. The electron beam, which has passed through the through-hole of the mark 40, enters the current detector 50, and a beam current is detected. For instance, SSD (semiconductor detector (solid-state detector)) can be used as the current detector

50. The results of detection by the current detector 50 is notified to a control calculator 110.

The controller 100 has the control calculator 110, a deflection control circuit 130, a digital-analog conversion (DAC) amplifier 131, a detection amplifier 134, a stage position detector 135, and a storage device 140. The storage device 140 is a magnetic disk unit or the like, and receives and stores writing data input from the outside.

The deflection control circuit 130 is connected to the DAC amplifier 131. The DAC amplifier 131 is connected to the deflector 17.

The control calculator 110 includes a writing data processor 111, a writing controller 112, a mark position calculator 113, a corrector 114, a beam position calculator 115, and a centroid position calculator 116. The function of each component of the control calculator 110 may be implemented by hardware, or implemented by software. When a component is comprised of software, a program to implement at least part of the function of the control calculator 110 may be stored in a recording medium, and read into a computer including a CPU and executed by the computer. The recording medium is not limited to a removable recording medium, such as a magnetic disk and an optical disk, and may be a fixed recording medium, such as a hard disk drive and a memory.

Figure 2:
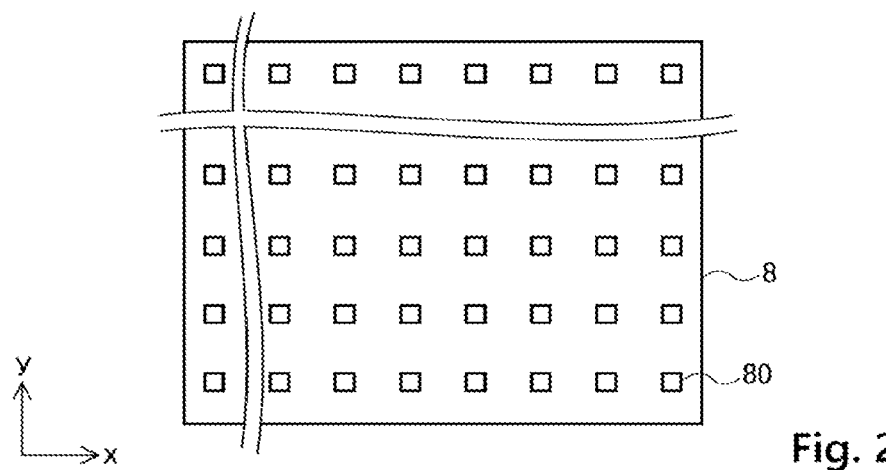
FIG. 2 is a plan view of a shaping aperture array substrate.

FIG. 2 is a conceptual diagram illustrating the configuration of the shaping aperture array substrate 8. As illustrated in FIG. 2, in the shaping aperture array substrate 8, openings 80 with m vertical (y direction) rows×n horizontal (x direction) rows (m, n>=2) are formed in a matrix with a predetermined arrangement pitch.

An electron beam 30 discharged from the electron gun 4 illuminates the shaping aperture array substrate 8 substantially perpendicularly by the illuminating lens 6. The electron beam 30 illuminates a region including the openings 80 of the shaping aperture array substrate 8. Parts of the electron beam 30 pass through respective plurality of openings 80, thus multi-beam 30*a* to 30*e* with a predetermined pitch, size is formed as illustrated in FIG. 1. Note that a multi-beam may be formed using a photocathode.

In the blanking plate 10, passage holes (openings), through which respective beams in a multi-beam pass, are formed at the positions corresponding to the openings 80 of the shaping aperture array substrate 8 illustrated in FIG. 2. In the vicinity of each passage hole, electrodes (blanker: blanking deflector) for blanking deflection, which deflect a beam, are disposed.

The multi-beam 30*a* to 30*e*, which pass through respective passage holes, are each independently deflected by a voltage applied from a corresponding blanker. Blanking control is performed by this deflection. In this manner, a plurality of blankers perform blanking deflection on corresponding beams of the multi-beam which has passed through the plurality of openings 80 of the shaping aperture array substrate 8.

The multi-beam 30*a* to 30*e*, which have passed the blanking plate 10, are demagnified in beam size and arrangement pitch by the demagnification lens 12, and move to an opening formed in the center of the limiting aperture member 14. The trajectory of each electron beam deflected by a blanker of the blanking plate 10 deviates and is displaced in position from the opening in the center of the limiting aperture member 14, and is blocked thereby. In contrast, each electron beam not deflected by a blanker of the blanking plate 10 passes through the opening in the center of the limiting aperture member 14.

The multi-beam 30a to 30e, which have passed through the limiting aperture member 14, are adjusted in focus by the object lens 15, and form a pattern image with a desired demagnification ratio on the substrate 70. An electrostatic lens can be used as the object lens 15. The deflector 17 collectively deflects the entire multi-beam which has passed through the limiting aperture member 14 in the same direction to irradiate the writing position (irradiation position) on the substrate 70 with the multi-beam.

When the XY stage 22 is continuously moved, tracking control is performed by the deflector 17 so that the writing position (irradiation position) of the beams follows the movement of the XY stage 22. The position of the XY stage 22 is measured by radiating a laser from the stage position detector 135 to the mirror 24 on the XY stage 22, and using the reflected light.

The multiple beams radiated at one time are ideally arranged with the pitch which is the product of the arrangement pitch of the plurality of openings 80 of the shaping aperture array substrate 8 and the above-mentioned desired demagnification ratio. The writing apparatus performs a writing operation by a raster scan method for continuously irradiating with a shot beam sequentially, and when a desired pattern is written, a necessary beam is controlled at beam-ON by the blanking control according to the pattern.

The writing data processor 111 of the control calculator 110 reads writing data from the storage device 140, and performs data conversion in multiple stages to generate shot data. In the shot data, irradiation on/off and an irradiation time of each of irradiation regions, into which the writing surface of the substrate 70 is divided, for instance, in a lattice pattern with the beam size, are defined.

The writing controller 112 outputs a control signal to the deflection control circuit 130 based on the shot data and the stage position information. The deflection control circuit 130 controls the voltage applied to each blanker of the blanking plate 10 based on the control signal. In addition, the deflection control circuit 130 calculates deflection amount data so that beams are radiated to a desired position on the substrate 70, and outputs the deflection amount data to the DAC amplifier 131. The DAC amplifier 131 converts a digital signal into an analog signal, amplifies the analog signal, and applies it to the deflector 17 as the deflection voltage. The deflector 17 deflects the multi-beam according to the applied deflection voltage.

Figure 3:
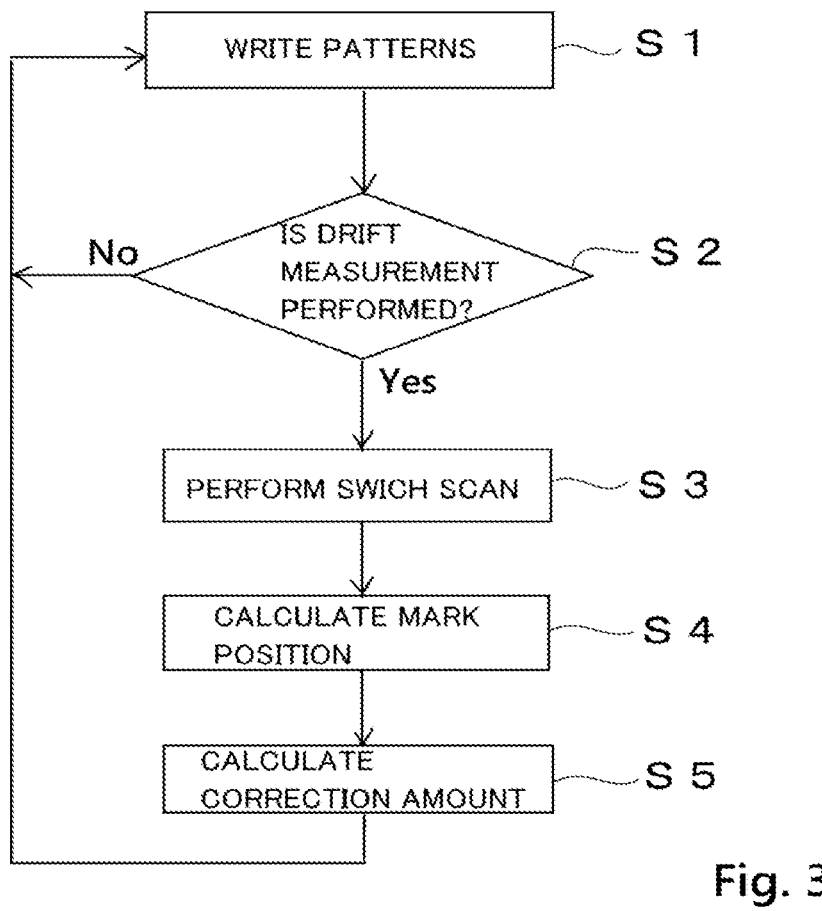
FIG. 3 is a flowchart illustrating a writing method according to the embodiment.

In the writing apparatus, beam drift may occur due to the effect of adherence of contamination, and deviation of the beam irradiation position may occur. Thus, it is necessary to temporarily halt a pattern writing process at a predetermined timing, scan the mark M with a multi-beam to measure the mark position, and make adjustment (drift correction) on the irradiation position. A writing method including drift correction will be described based on the flowchart illustrated in FIG. 3.

Irradiate the substrate 70 with a multi-beam to write a pattern (step S1). At a timing for drift measurement after elapse of a predetermined time (step S2_Yes), temporarily halt pattern writing, and scan the mark M with a multi-beam (on-beam) in which only part of the beams is set to ON (step S3). At this point of time, the scanning direction is preferably a perpendicular direction to edge E (see FIG. 4a) of the mark M; however, it is sufficient that the scanning direction have a perpendicular component.

Figure 13:
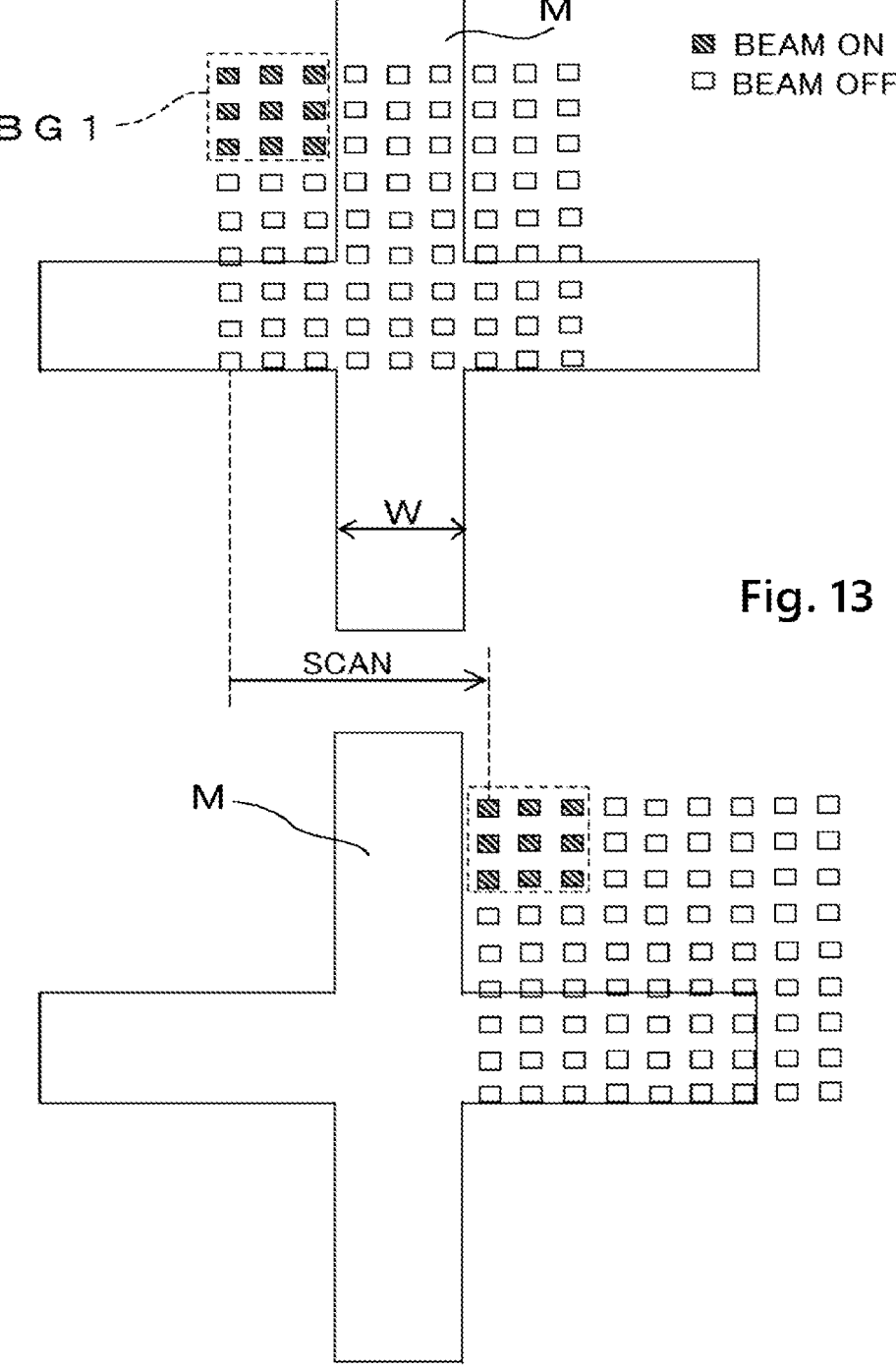
FIG. 13 is a view for illustrating deflection scan.

In the embodiment, as illustrated in FIG. 13, the mark M is not scanned by deflecting a multi-beam by the deflector 17, but is scanned in a pseudo manner by changing (shifting) the region with beam ON. Hereinafter, scanning the mark M by deflecting a multi-beam (on-beam) by the deflector 17 is referred to as "deflection scan", and scanning the mark M in a pseudo manner by changing the region with beam ON is referred to as "switch scan".

Figures 4A, 4B, 4C, 4D:
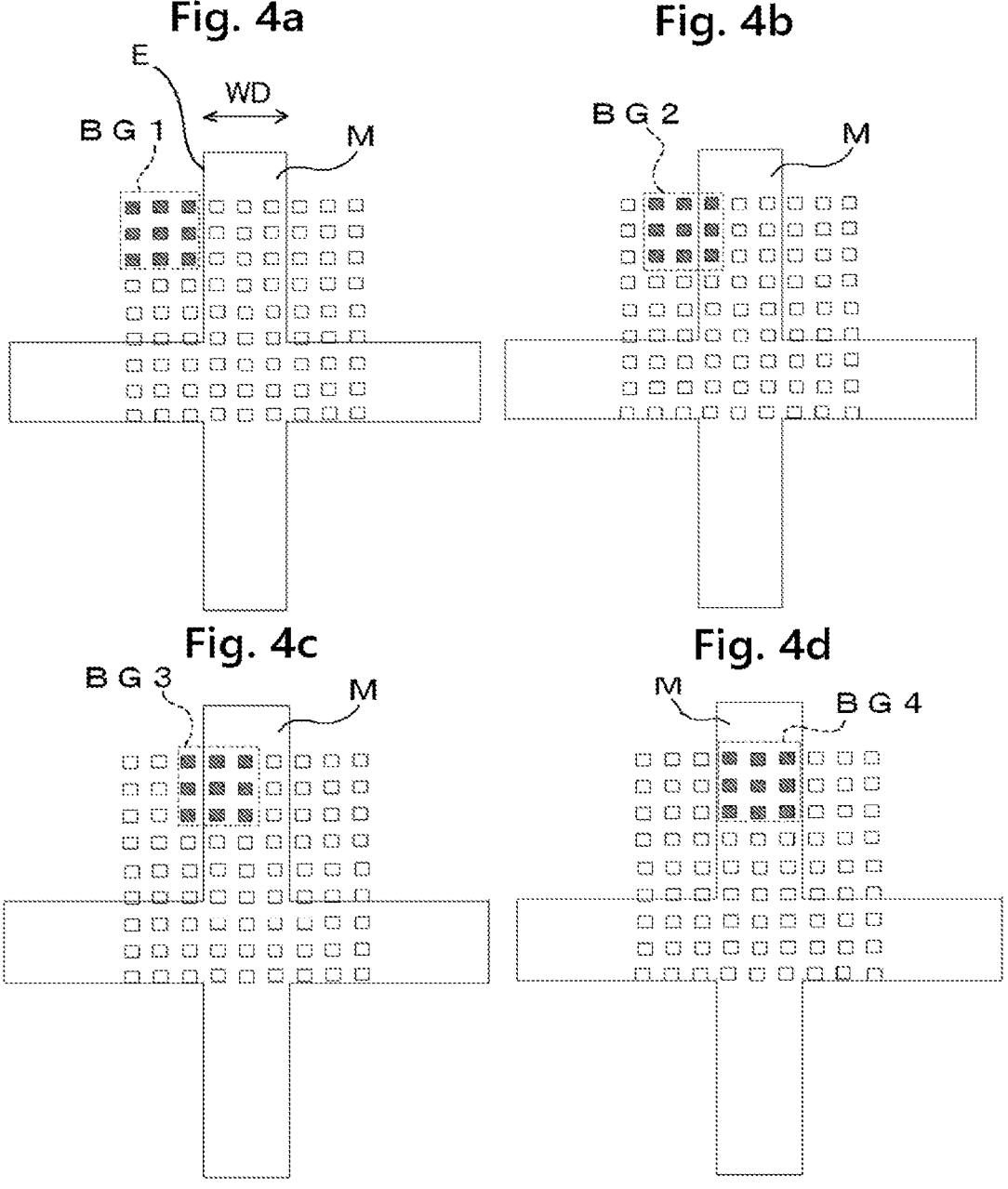
FIGS. 4a to 4d are views for illustrating switch scan.
Figures 5A, 5B, 5C:
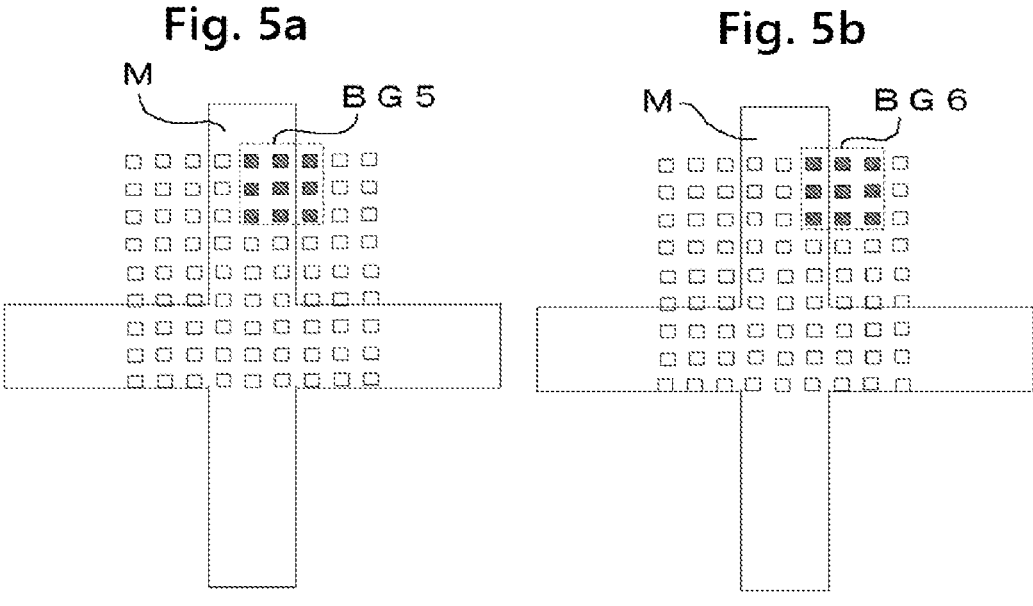
FIGS. 5a to 5c are views for illustrating switch scan.

An example of switch scan is illustrated in FIGS. 4a to 4d and FIGS. 5a to 5c. First, as illustrated in FIG. 4a, the beams in region BG1 which is part of a multi-beam are set to ON, and the beams in other regions are set to OFF. In this example, of the 81 (=9×9) beams, nine (=3×3) beams in the region BG1 located at the upper left of FIG. 4a are set to ON. The detector 26 detects a reflected electron signal from the mark M. The width of the mark M is smaller than the size of the entire multi-beam, and greater than the pitch of the multi-beam on the substrate. The on-beam region includes a plurality of individual beams which are arranged along a direction perpendicular to mark edge E of the mark M in width direction WD and a direction (mark edge extending direction) parallel to the mark edge E in the width direction WD.

Next, as illustrated in FIG. 4b, the region with beam on is shifted to the right by one row, and the beams in region BG2 are set to ON. The detector 26 detects a reflected electron signal from the mark M.

Subsequently, as illustrated in FIG. 4c, FIG. 4d, FIG. 5a, FIG. 5b, FIG. 5c, the region with beam on is shifted to the right by one row, and the beams in regions BG3, BG4, BG5, BG6, BG7 are set to ON sequentially. Each time the region with beam on is changed, the detector 26 detects a reflected electron signal from the mark M.

Changing the on-beam region from the region BG1 to the region BG7 sequentially enables mark scan similar to deflection scanning of the mark M with the beams in the region BG1 as illustrated in FIG. 13.

Figure 6:
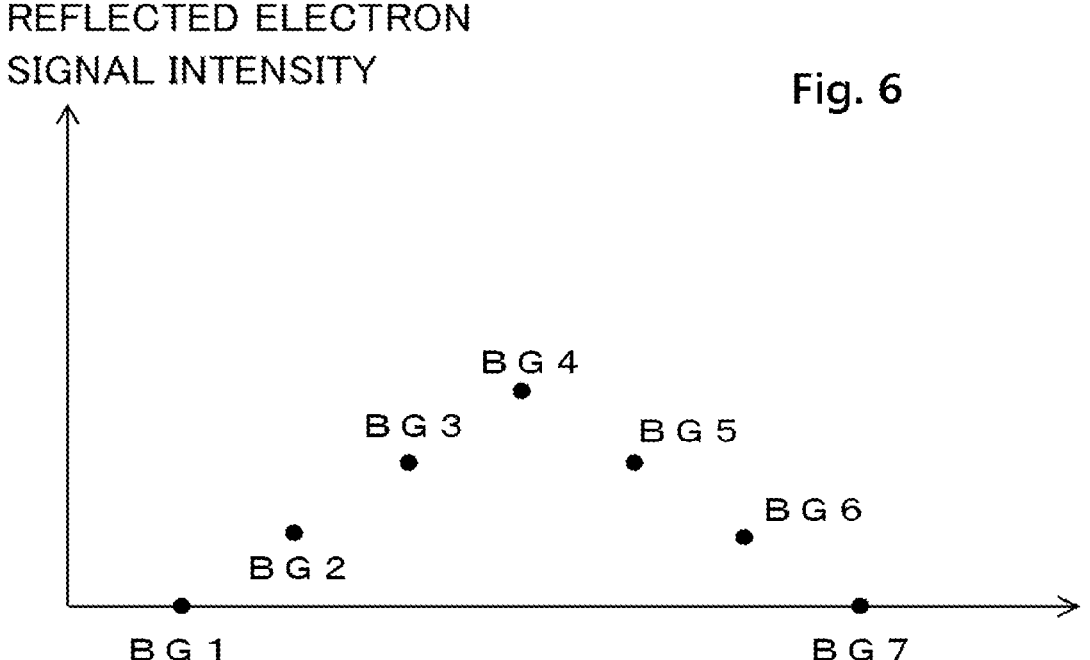
FIG. 6 is a graph illustrating results of detection of a reflected electron signal.

The results of detection of a reflected electron signal by the detector 26 are as illustrated in FIG. 6. The mark position calculator 113 calculates the mark position from the results of detection of a reflected electron signal by the detector 26, and measures the deviation of the mark position based on the calculated mark position and the stage position information detected by the stage position detector 135 (step S4).

The corrector 114 calculates a correction amount (deflection correction amount) for correcting (calibrating) the deviation of the mark position by the deflector 17 (step S5). The calculated correction amount is stored in a storage device which is not illustrated. In subsequent pattern writing (step S1), irradiation position adjustment, such as drift correction, can be made by deflecting the irradiation position (deflection position) of a multi-beam to a position displaced by a correction amount.

In this manner, according to the embodiment, the mark M is scanned in a pseudo manner by changing the on-beam region, thus the occurrence of deflection distortion can be prevented, and the mark position can be measured accurately. As a result, position deviation due to beam drift can be corrected with high precision.

In the example illustrated in FIG. 4, FIG. 5, a case has been described in which the on-beam region is shifted by one row at a time in the width direction (switch scan direction) of the mark M; however, the on-beam region may be shifted by multiple rows at a time. However, the mark position can be measured with higher accuracy for a smaller number a of rows by which the on-beam region is shifted. For instance, it is preferable that at least part of the first on-beam region and the second on-beam region shifted by a rows be overlapped.

In the embodiment above, an example has been described, in which the mark M on the XY stage 22 is switch scanned.

7

Figure 7:
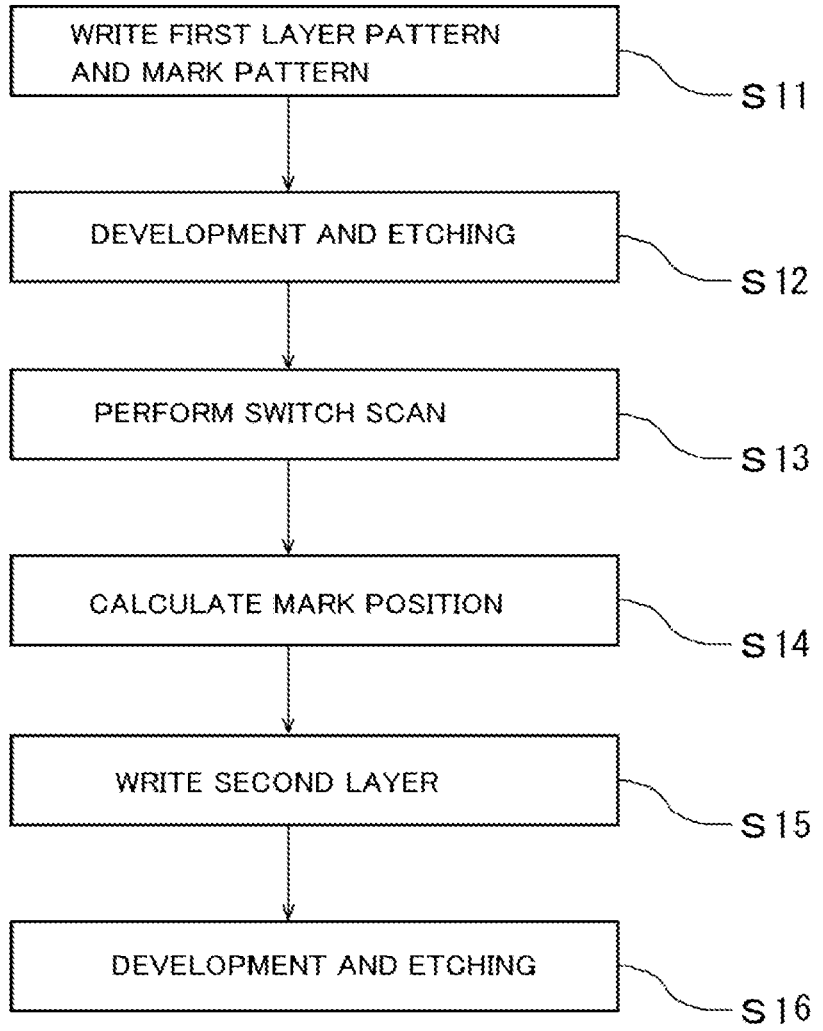
FIG. 7 is a flowchart illustrating a writing method according to another embodiment.

However, when a phase shift mask is formed, the mark for alignment, provided in the substrate 70 may be switch scanned. A method of writing a pattern for phase shift mask will be described based on the flowchart illustrated in FIG. 7.

First, the substrate 70, in which a half tone film, a light shielding film, and a resist film are sequentially laminated on a glass substrate, is prepared. For instance, an MoSi film can be used as the half tone film. For instance, a Cr film can be used as the light shielding film. As the first layer writing step (step S11), the main pattern as an actual pattern for the first layer is written on the central part of the substrate 70. A cross-shaped mark pattern is written on a mark region around the main pattern for the first layer.

Development and etching processes are performed on the substrate 70 on which the first layer pattern and the mark pattern have been written (step S12). The resist in the beam irradiation region is removed by the development process to form a resist pattern. Exposed light shielding film and half tone film are removed by etching using the resist pattern as a mask. Subsequently, a resist film is removed by ashing or the like, thus the main pattern for the first layer and the mark around the main pattern are formed on the substrate 70.

Furthermore, the substrate 70 with a resist film formed is carried into the writing chamber 20. When the pattern for the second layer is written, the mark M is switch scanned, and the mark position is calculated (step S13, S14).

Alignment calculation is performed based on the calculated mark position, and the main pattern for the second layer is written at an aligned position on the substrate 70 (step S15). The development and etching processes are performed on the substrate 70 on which the second layer pattern has been written, then the second layer pattern is formed (step S16). In this manner, a phase shift mask can be manufactured.

The position of the mark M formed along with the first layer pattern can be measured with high accuracy by switch scan, thus highly accurate alignment can be achieved. As a result, a mask loss due to position deviation can be reduced.

Note that such switch scan can be used not only for the above-described drift correction and alignment of the phase shift mask, but also for writing position adjustment to avoid a dirt defect portion of EUV mask, thus phase defect of the pattern at the time of EUV exposure can be reduced.

It is possible to combine switch scan and deflection scan with a small deflection amount, causing almost no deflection distortion. For instance, as illustrated in FIG. 8*a*, FIG. 8*b*, the beams in the region BG1 are set to ON, and the mark M is deflection scanned in a narrow range. The deflection amount of the deflection scan is, for instance, less than or equal to the width of the mark M. The detector 26 detects a reflected electron signal from the mark M. The results of detection are as illustrated in FIG. 8*c*.

Figures 9A, 9B:
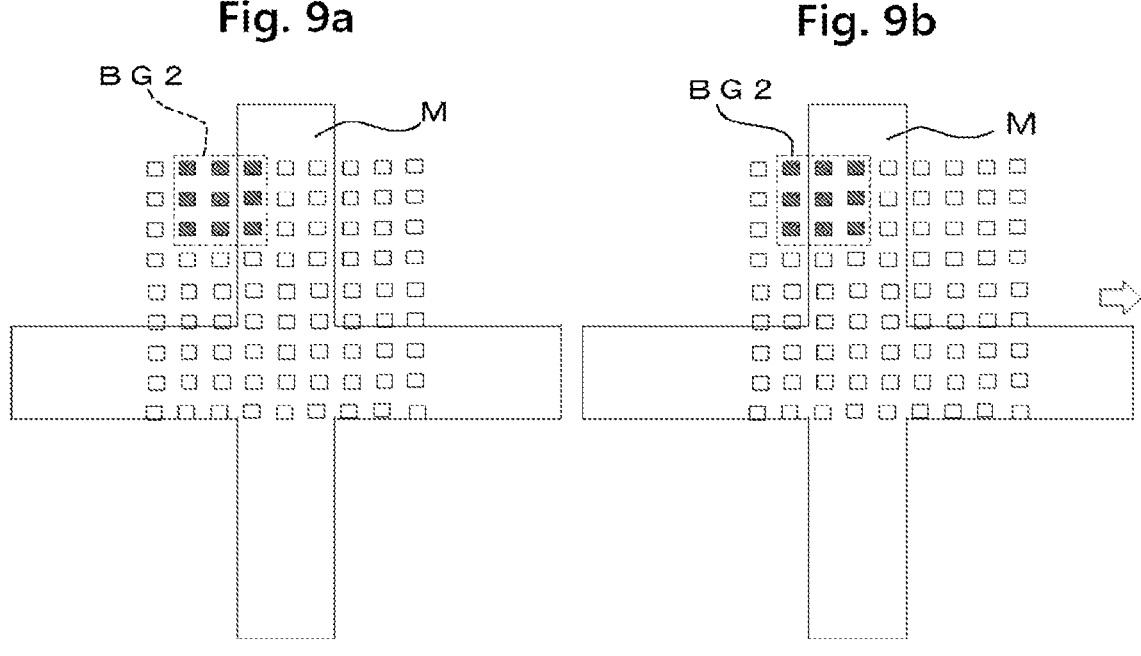
FIG. 9*a*, FIG. 9*b* are views for illustrating a scan method.
Figure 9C:
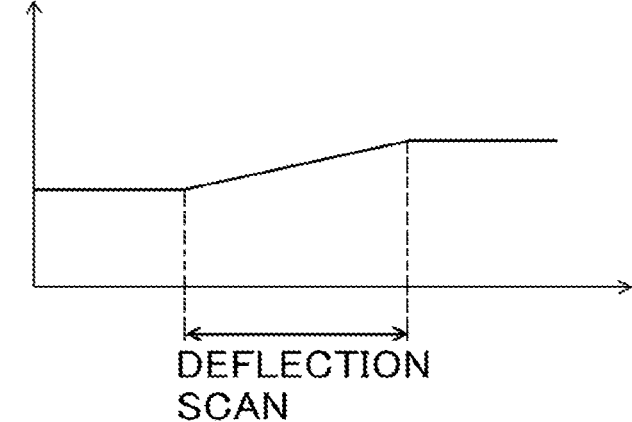
FIG. 9*c* is a graph illustrating results of detection of a reflected electron signal.

The deflection position is returned, and as illustrated in FIG. 9*a*, FIG. 9*b*, the region with beam on is shifted to the right by one row, and the beams in the region BG2 are set to ON. The mark M is deflection scanned in a narrow range with the beams in the region BG2. The detector 26 detects a reflected electron signal from the mark M. The results of detection are as illustrated in FIG. 9*c*.

The on-beam region is changed sequentially, and for each change, the mark M is deflection scanned in a narrow range. FIG. 10*a*, FIG. 10*b* illustrate an example in which the beams in the region BG6 are set to ON, and the mark M is deflection scanned in a narrow range. The results of detection of a reflected electron signal are as illustrated in FIG. 10*c*. The direction of on-beam region shift accompanied by the change of the on-beam region, and the direction of deflection of the on-beam due to deflection scan are both parallel to the width direction of the mark M.

The profile as illustrated in FIG. 11 is obtained by combining the results of detection of a reflected electron signal obtained by deflection scan of each on-beam region. The mark position can be calculated from the profile.

The shape (beam shape) of the entire multi-beam image radiated on the substrate is ideally a rectangle (for instance, a square); however, the beam shape may change due to various factors. For instance, as illustrated in FIG. 12*a*, FIG. 12*b*, the beam shape may be distorted. In such a case, it is preferable that the position of the centroid of the on-beam region be determined from the positions of individual beams, and the mark position be calculated in consideration of the centroid position.

The positions of the individual beams are calculated as follows. First, the mark 40 is deflection scanned with a multi-beam. Thus, beams sequentially pass through the through-hole formed in the mark 40 one by one. The current detector 50 sequentially detects the beam current of each individual beam which has passed through the mark 40. The beam position calculator 115 calculates the position of each individual beam from the results of beam current detection.

The centroid position calculator 116 calculates the centroid position of the on-beam region based on the positions of multiple individual beams included in the on-beam region. For instance, as illustrated in FIG. 12*a*, FIG. 12*b*, the centroid position (X1, Y1) of the on-beams in the region BG1, and the centroid position (X4, Y4) of the on-beams in the region BG4 are calculated.

Although the present invention has been described in detail by way of the specific modes, it is apparent for those skilled in the art that various changes can be made without departing from the spirit and scope of the present invention.

The present application is based on Japanese Patent Application No. 2020-027319 filed on Feb. 20, 2020, the entire contents of which are incorporated herein by reference.

REFERENCE SIGNS LIST

1 WRITER
2 COLUMN
4 ELECTRON GUN
6 ILLUMINATING LENS
8 SHAPING APERTURE ARRAY SUBSTRATE
10 BLANKING PLATE
12 DEMAGNIFICATION LENS
14 LIMITING APERTURE MEMBER
15 OBJECT LENS
17 DEFLECTOR
20 WRITING CHAMBER
22 XY STAGE
28 MARK SUBSTRATE
40 MARK FOR BEAM POSITION DETECTION
100 CONTROLLER
110 CONTROL CALCULATOR

The invention claimed is:

1. A multi charged particle beam writing method comprising:
forming a multi-beam in which N charged particle beams are arranged in a beam region having a plurality of irradiating positions with a predetermined pitch;
irradiating a mark with M beams (M<N) set to ON in an on-beam region of M irradiating positions of the beam region, while switching irradiation positions of the M beams within the beam region by sequentially shifting the on-beam region in a predetermined direction in the beam region, the mark being provided at a predetermined position and having a width greater than the predetermined pitch, detecting a reflected charged particle signal from the mark, and calculating a position of the mark; and adjusting the irradiation positions of the multi-beam based on the calculated position of the mark, and writing a pattern, wherein irradiating the mark with M beams (M<N) set to ON in the on-beam region of M irradiating positions of the beam region, while switching irradiation positions of the M beams within the beam region by sequentially shifting the on-beam region in the predetermined direction in the beam region comprises:

positioning the beam region on the mark, irradiating the M beams set to ON in M of the irradiating positions in the beam region, and sequentially shifting the M irradiating positions in the predetermined direction to M shifted irradiating positions within the beam region and irradiating the M beams at the M shifted irradiating positions, without moving the beam region.

2. The multi charged particle beam writing method according to claim 1, wherein when irradiation is performed with the beams in the on-beam region, the beams in the on-beam region are deflected in a direction of the shift by a predetermined amount.

3. The multi charged particle beam writing method according to claim 2, wherein a position of the mark is detected by irradiating with beams in a different on-beam region at two edges of the mark in the direction of the shift.

4. The multi charged particle beam writing method according to claim 1, wherein the direction of the shift is a perpendicular direction to an edge of the mark in a width direction.

5. The multi charged particle beam writing method according to claim 1, wherein positions of a plurality of individual beams in the on-beam region are measured, a centroid position of the on-beam region is calculated based on the positions of the plurality of individual beams, and a position of the mark is calculated using the centroid position of the on-beam region.

6. The multi charged particle beam writing method according to claim 1, wherein a first on-beam region and a second on-beam region before and after change of the on-beam region are partially overlapped with each other.

7. The multi charged particle beam writing method according to claim 1, wherein the mark is provided on a stage on which a writing target substrate is placed.

8. The multi charged particle beam writing method according to claim 1, wherein the mark is formed in a half tone film and a light shielding film sequentially laminated on a glass substrate, and the glass substrate is placed on a stage.

9. The multi charged particle beam writing method according to claim 1, wherein the on-beam region includes a plurality of beams which are arranged along a direction perpendicular and a direction parallel to an edge of the mark in the width direction.

10. A multi charged particle beam writing apparatus comprising:

an aperture array substrate forming a multi-beam in which N charged particle beams are arranged in a beam region having a plurality of irradiating positions with a predetermined pitch;

a stage on which a writing target substrate is placed, the writing target substrate being to be irradiated with the multi-beam;

a controller configured to switch irradiation positions of a portion of the charged particle beams set to ON irradiating an on-beam region, the portion being less than all of the charged particle beams by sequentially moving the on-beam region within the beam region in a predetermined direction;

a mark being provided on the stage or on the writing target substrate and having a width greater than the predetermined pitch; and a mark position calculator calculating a position of the mark based on a reflected charged particle signal detected by irradiating the mark with beams in the on-beam region, wherein the portion of the charged particle beams set to ON irradiating the on-beam region is M beams, and the controller is further configured to irradiate the mark with M beams (M<N) set to ON in the on-beam region of M irradiating positions of the beam region, while switching irradiation positions of the M beams within the beam region by sequentially shifting the on-beam region in the predetermined direction in the beam region;

position the beam region on the mark, irradiate the M beams set to ON in M of the irradiating positions in the beam region, and sequentially shift the M irradiating positions in the predetermined direction to M shifted irradiating positions within the beam region and irradiating the M beams at the M shifted irradiating positions, without moving the beam region.

11. The multi charged particle beam writing apparatus according to claim 10, further comprising a deflector deflecting the beams in the on-beam region in a direction of the shift by a predetermined amount when irradiation is performed with the beams in the on-beam region.

12. The multi charged particle beam writing apparatus according to claim 10, wherein the direction of the shift is a perpendicular direction to an edge of the mark in a width direction.

13. The multi charged particle beam writing method according to claim 1, comprising halting a writing process using the charged particle beams, and irradiating the mark while the writing process is halted.

14. A multi charged particle beam writing method comprising:

forming a multi-beam in which N charged particle writing beams are arranged with a predetermined pitch at respective positions in a beam region;

irradiating a mark with selected writing beams set to ON of the multi-beam corresponding to positions in a partial on-beam region of the beam region while sequentially changing the positions in the beam region of the on-beam region in which the writing beams are set to ON, the mark being provided at a predetermined position and having a width greater than the predetermined pitch, detecting a reflected charged particle signal from the mark, and calculating a position of the mark; and adjusting the irradiation positions of the multi-beam based on the calculated position of the mark, and writing a pattern, wherein irradiating with selected writing beam comprises irradiating the mark with M beams (M<N) set to ON in the on-beam region of M irradiating positions of the beam region, while switching irradiation positions of the M beams within the beam region by sequentially shifting the on-beam region in the predetermined direction in the beam region comprises:

positioning the beam region on the mark, and irradiating the M beams set to ON in M of the irradiating positions in the beam region, and sequentially changing the positions in the beam region of the on-beam region in which the writing beams are set to ON comprises sequentially changing the M irradiating positions in the predetermined direction to M shifted irradiating positions within the beam region and irradiating the M beams at the M shifted irradiating positions, without moving the beam region.

15. The multi charged particle beam writing method according to claim 1, wherein irradiating the mark with M beams (M<N) set to ON in the on-beam region of M irradiating positions of the beam region, while switching irradiation positions of the M beams within the beam region by sequentially shifting the on-beam region in the predetermined direction in the beam region comprises:

positioning the beam region on the mark, irradiating the M beams set to ON in M of the irradiating positions in the beam region, and sequentially shifting the M irradiating positions in the predetermined direction to M shifted irradiating positions within the beam region and irradiating the M beams at the M shifted irradiating positions, without moving the beam region.

16. A multi charged particle beam writing method comprising forming a multi-beam in which N charged particle beams are arranged in a beam region having a plurality of irradiating positions with a predetermined pitch;

irradiating a mark with M beams (M<N) set to ON in an on-beam region of M irradiating positions of the beam region, while switching irradiation positions of the M beams within the beam region by sequentially shifting the on-beam region in a predetermined direction in the beam region, the mark being provided at a predetermined position and having a width greater than the predetermined pitch, detecting a reflected charged particle signal from the mark, and calculating a position of the mark; and adjusting the irradiation positions of the multi-beam based on the calculated position of the mark, and writing a pattern, wherein irradiating the mark with M beams (M<N) set to ON in the on-beam region of M irradiating positions of the beam region, while switching irradiation positions of the M beams within the beam region by sequentially shifting the on-beam region in the predetermined direction in the beam region comprises:

positioning the beam region on the mark, setting M of the irradiating positions in the beam region to ON, irradiating only the M beams in M of the irradiating positions in the beam region set to ON, then switching to OFF a predetermined number of the M irradiating positions in the beam region set to ON, switching to ON the predetermined number of irradiating positions adjacent in the predetermined direction to ones of the M irradiating positions remaining ON, and irradiating M beams only at the ones of the M irradiating positions remaining ON and the predetermined number of adjacent irradiating positions switched to ON.

17. The multi charged particle beam writing method according to claim 16, wherein the M irradiating positions comprise a plurality of columns, the predetermined number of irradiating positions switched to OFF is one of the columns, and the predetermined number of irradiating positions switched to ON is one column of irradiating positions adjacent to the columns of radiating positions remaining ON.

18. The multi charged particle beam writing method according to claim 1, comprising moving the multi-beam from the mark to a position on a writing target after calculating the mark position.

19. The multi charged particle beam writing method according to claim 7, wherein the mark is a metal mark.

* * * * *